(12) United States Patent
Seo et al.

(10) Patent No.: US 11,903,267 B2
(45) Date of Patent: Feb. 13, 2024

(54) ORGANIC LIGHT-EMITTING DISPLAY APPARATUS

(71) Applicant: Samsung Display Co., Ltd., Yongin-si (KR)

(72) Inventors: Hae-Kwan Seo, Yongin-si (KR); Do-Youb Kim, Yongin-si (KR); Bon-Seog Gu, Yongin-si (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 256 days.

(21) Appl. No.: 15/249,831

(22) Filed: Aug. 29, 2016

(65) Prior Publication Data

US 2016/0365401 A1 Dec. 15, 2016

Related U.S. Application Data

(63) Continuation of application No. 13/753,424, filed on Jan. 29, 2013, now abandoned.

(30) Foreign Application Priority Data

Jun. 13, 2012 (KR) .................. 10-2012-0063408

(51) Int. Cl.
*H10K 59/128* (2023.01)
*H10K 50/80* (2023.01)
(Continued)

(52) U.S. Cl.
CPC ........... *H10K 59/128* (2023.02); *H10K 50/80* (2023.02); *H10K 59/121* (2023.02);
(Continued)

(58) Field of Classification Search
CPC ... H01L 51/52; H01L 27/3267; H01L 27/326; H01L 27/3262; H01L 27/3265; H01L 27/3276
See application file for complete search history.

(56) References Cited

U.S. PATENT DOCUMENTS 7,772,760 B2 8/2010 Yoo et al.
2004/0227159 A1* 11/2004 Nakashima .......... G09G 3/3225
257/202
(Continued)

FOREIGN PATENT DOCUMENTS

KR 10-2005-0029824 3/2005
KR 10-2011-0097046 8/2011
(Continued)

*Primary Examiner* — Aaron J Gray
*Assistant Examiner* — Christopher A Culbert
(74) *Attorney, Agent, or Firm* — F. Chau & Associates, LLC (57) ABSTRACT

An organic light-emitting display apparatus includes a plurality of first emission units, each including a first organic light-emitting device configured to emit light in at least a first direction and through a first display surface, a plurality of second emission units, each including a second organic light-emitting device configured to emit in a second direction opposite to the first direction and through a second display surface. The first emission units and the second emission units are alternately disposed. The apparatus further includes a transmissive area disposed adjacent to but not overlapping with the plurality of first emission units and the plurality of second emission units when viewed from a direction perpendicular to the first display surface, and capable of transmitting external light through the first and second display surfaces in the transmissive area.

5 Claims, 8 Drawing Sheets

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(56) References Cited

U.S. PATENT DOCUMENTS

| | | | | |
|---|---|---|---|---|
| 2004/0263425 | A1* | 12/2004 | Anzai | G06F 1/32 345/1.1 |
| 2011/0198629 | A1* | 8/2011 | Lee | H01L 27/3213 257/89 |
| 2011/0205198 | A1* | 8/2011 | Jeong | H01L 27/326 345/205 |
| 2012/0074435 | A1 | 3/2012 | Ha et al. | |

FOREIGN PATENT DOCUMENTS

| | | |
|---|---|---|
| KR | 10-2011-0116255 | 10/2011 |
| KR | 10-2012-0031365 | 4/2012 |

* cited by examiner

ORGANIC LIGHT-EMITTING DISPLAY APPARATUS

RELATED APPLICATIONS

This application claims the benefit of U.S. patent application Ser. No. 13/753,424, filed on Jan. 29, 2013, and Korean Patent Application No. 10-2012-0063408, filed on Jun. 13, 2012, in the Korean Intellectual Property Office, the disclosure of which are incorporated herein in their entirety by reference.

BACKGROUND

Field

The present disclosure relates to an organic light-emitting display apparatus, and more particularly, to a transparent organic light-emitting display apparatus.

Description of the Related Art

Organic light-emitting display apparatuses are widely used in personal portable apparatuses including a moving picture experts group layer 3 (MP3) player, a mobile phone, or the like, and TVs, due to its excellent characteristics with respect to viewing angles, contrast, response times, power consumption, and the like.

The organic light-emitting display apparatuses have a self-emission characteristic, and thus do not require a separate light source, unlike a liquid crystal display (LCD) apparatus. Therefore, a thickness and a weight of the organic light-emitting display apparatus may be reduced.

Also, the organic light-emitting display apparatus may have a transparent thin-film transistor (TFT) or a transparent organic light-emitting device, so that the organic light-emitting display apparatus may be formed as a transparent display apparatus.

When the transparent display apparatus is in a switch-off state, an object or an image on a side of the transparent display apparatus opposite to a user is visible to the user via patterns of the organic light-emitting device, the TFT, several wirings, and gaps therebetween. However, although the organic light-emitting display apparatus is the transparent display apparatus, transmittances of the organic light-emitting device, the TFT, and the several wirings are not excellent, and the gaps therebetween are very small, and thus transmittance of the organic light-emitting display apparatus is not high.

Also, due to the patterns, i.e., the patterns of the organic light-emitting device, the TFT, and the several wirings, the user may view a distorted image. Because a distance between the patterns is in the range of several hundreds of nm, which is the same level as wavelengths of visible light, scattering of light occurs.

SUMMARY OF CERTAIN INVENTIVE ASPECTS

According to an aspect of the present invention, there is provided an organic light-emitting display apparatus including a plurality of first emission units, each including a first organic light-emitting device configured to emit light in at least a first direction and through a first display surface; a plurality of second emission units, each including a second organic light-emitting device configured to emit light in a second direction opposite to the first direction and through a second display surface opposing the first display surface, wherein the first emission units and the second emission units are alternately disposed; and a transmissive area disposed adjacent to but not overlapping with the plurality of first emission units and the plurality of second emission units when viewed from a direction perpendicular to the first display surface, and capable of transmitting external light through the first and second display surfaces in the transmissive area.

At least one of the first emission units and at least one of the second emission units may be adjacent to a side of the transmissive area.

The organic light-emitting display apparatus may further include a plurality of first circuit units, each of which is electrically connected to one of the plurality of first emission units, and does not overlap with the connected one of the plurality of first emission units when viewed from the direction, and a plurality of second circuit units, each of which is electrically connected to one of the plurality of second emission units, and overlaps with the connected one of the plurality of second emission units when viewed from the direction.

The organic light-emitting display apparatus may further include a plurality of circuit units, each of which is electrically connected to one of the plurality of first emission units and one of the plurality of second emission units, and overlaps with the connected one of the plurality of second emission units when viewed from the direction.

At least one of the first emission units and at least one of the second emission units may be adjacent to two opposite sides of the transmissive area, respectively.

The organic light-emitting display apparatus may further include a plurality of first circuit units, each of which is electrically connected to one of the plurality of first emission units, and does not overlap with the connected one of the plurality of first emission units when viewed from the direction, and a plurality of second circuit units, each of which is electrically connected to one of the plurality of second emission units, and overlaps with the connected one of the plurality of second emission units when viewed from the direction.

The organic light-emitting display apparatus may further include a plurality of circuit units, each of which is electrically connected to one of the plurality of first emission units and one of the plurality of second emission units, and overlaps with the connected one of the plurality of second emission units when viewed from the direction.

At least a portion of the transmissive area may be disposed between at least one of the plurality of first emission units and at least one of the plurality of second emission units.

The organic light-emitting display apparatus may further include a see-through window formed in the transmissive area.

According to another aspect of the present invention, there is provided an organic light-emitting display apparatus including a substrate; a plurality of first pixels formed over the substrate and including a plurality of first emission units configured to emit light in at least first direction and through a first display surface; a plurality of second pixels formed on the substrate, including a plurality of second emission units configured to emit in a second direction opposite to the first direction and through a second display surface opposing the first display surface, wherein the first pixels and the second pixels are alternately disposed; a plurality of first pixel electrodes, each of which is disposed in one of the plurality of first emission units of the plurality of first pixels, and includes a transparent conductive layer or a transflective conductive layer; a plurality of second pixel electrodes, each of which is disposed in one of the plurality of second emission units of the plurality of second pixels, and includes a reflective layer; a first opposite electrode facing the plurality of first pixel electrodes; a second opposite electrode facing the plurality of second pixel electrodes; a first organic layer interposed between one of the plurality of first pixel electrodes and the first opposite electrode, and including a first emission layer; a second organic layer interposed between one of the plurality of second pixel electrodes and the second opposite electrode, and including a second emission layer; and at least one transmissive area disposed adjacent to the plurality of first pixels and the plurality of second pixels, and capable of transmitting external light through the first and second display surfaces in the transmissive area.

The first opposite electrode and the second opposite electrode may be electrically connected.

At least one of the first pixels and at least one of the second pixels may be adjacent to a side of the transmissive area.

Each of the plurality of first pixels may further include a first circuit unit that is electrically connected to the corresponding first pixel electrode and that does not overlap with the corresponding first pixel electrode when viewed from a direction perpendicular to the first display surface, and wherein each of the plurality of second pixels may further include a second circuit unit that is electrically connected to the corresponding second pixel electrode and that overlaps with the corresponding second pixel electrode when viewed from the direction.

Each of the plurality of second pixels may further include a circuit unit that is electrically connected to the corresponding second pixel electrode and the first pixel electrode of an adjacent first pixel, and that overlaps with the corresponding second pixel electrode.

At least one of the first pixels and at least one of the second pixels may be adjacent to two opposite sides of the transmissive area, respectively.

Each of the plurality of first pixels may further include a first circuit unit that is electrically connected to the corresponding first pixel electrode and that does not overlap with the corresponding first pixel electrode when viewed from a direction perpendicular to the first display surface, and wherein each of the plurality of second pixels may further include a second circuit unit that is electrically connected to the corresponding second pixel electrode and that overlaps with the corresponding second pixel electrode when viewed from the direction.

Each of the plurality of second pixels may further include a circuit unit that is electrically connected to the corresponding second pixel electrode and the first pixel electrode of an adjacent first pixel, and that overlaps with the corresponding second pixel electrode when viewed from a direction perpendicular to the first display surface.

The organic light-emitting display apparatus may further include a see-through window formed in the transmissive area.

The second opposite electrode may include a metal layer capable of reflecting light, and the metal layer may include an opening that corresponds to at least the see-through window.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN INVENTIVE EMBODIMENTS

Hereinafter, embodiments of the present invention will be described in detail with reference to the attached drawings.

As used herein, the term "and/or" includes any and all combinations of one or more of the associated listed items.

Compared to the LCD apparatus, an organic light-emitting display apparatus may include a dual-emission device. In a dual-emission device, however, the same image may be realized on two sides such that the left and right of an image realized on one side is reversed in the same image realized on the other side.

In addition, it is possible to embody a dual-emission type display by manufacturing and attaching two independent organic light-emitting display apparatuses to form one display device with dual emission. However, it would be difficult to form this dual-emission display device as a transparent display apparatus.

Figure 1:
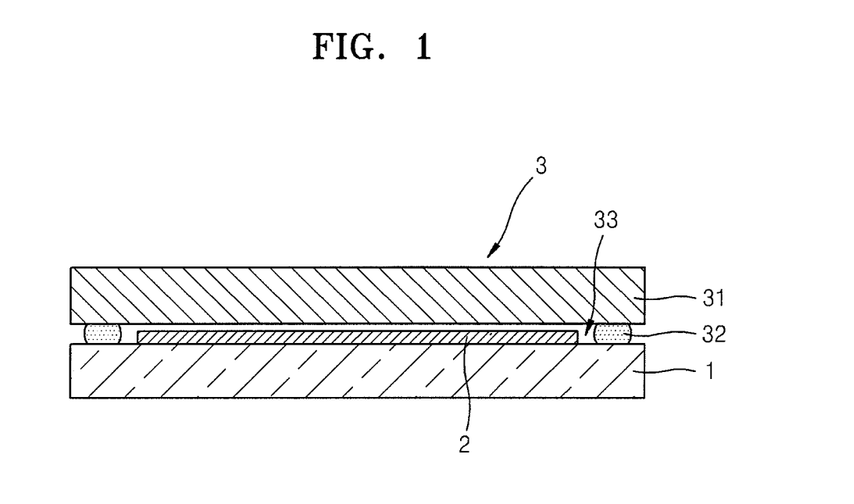
FIG. 1 is a cross-sectional view of an organic light-emitting display apparatus according to an embodiment of the present invention.

FIG. 1 is a cross-sectional view of an organic light-emitting display apparatus according to an embodiment of the present invention.

Referring to FIG. 1, the organic light-emitting display apparatus includes an organic light emission unit 2 that is formed on a surface of a substrate 1, and an encapsulation unit 3 that encapsulates the organic light emission unit 2. The substrate may include a display surface on which an image is formed.

The encapsulation unit 3 in the present embodiment illustrated in FIG. 1 may include an encapsulation substrate 31. The encapsulation substrate 31 may be formed as a transparent substrate so as to realize an image from the organic light emission unit 2 and on its surface and to prevent outside air and moisture from penetrating into the organic light emission unit 2.

Side ends of the substrate 1 and the encapsulation substrate 31 are combined by using an encapsulation member 32, so that a space 33 between the substrate 1 and the encapsulation substrate 31 is encapsulated. An absorbent or a filling member may be arranged in the space 33.

Figure 2:
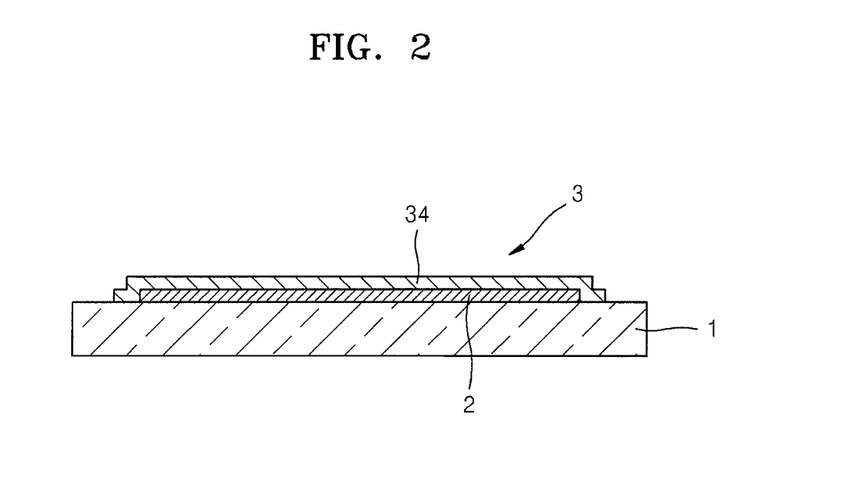
FIG. 2 is a cross-sectional view of an organic light-emitting display apparatus according to another embodiment of the present invention.

Instead of the encapsulation substrate 31, as shown in FIG. 2, a thin encapsulation film 34 may be formed on the organic light emission unit 2, so that the organic light emission unit 2 may be protected from outside air. The encapsulation film 34 may have a structure in which an inorganic layer that is formed of silicon oxide or silicon nitride and an organic layer that is formed of epoxy or polyimide are alternately stacked. However, the structure of the encapsulation film 34 is not limited thereto and thus any encapsulation structure having a transparent thin film may be used.

Figure 3:
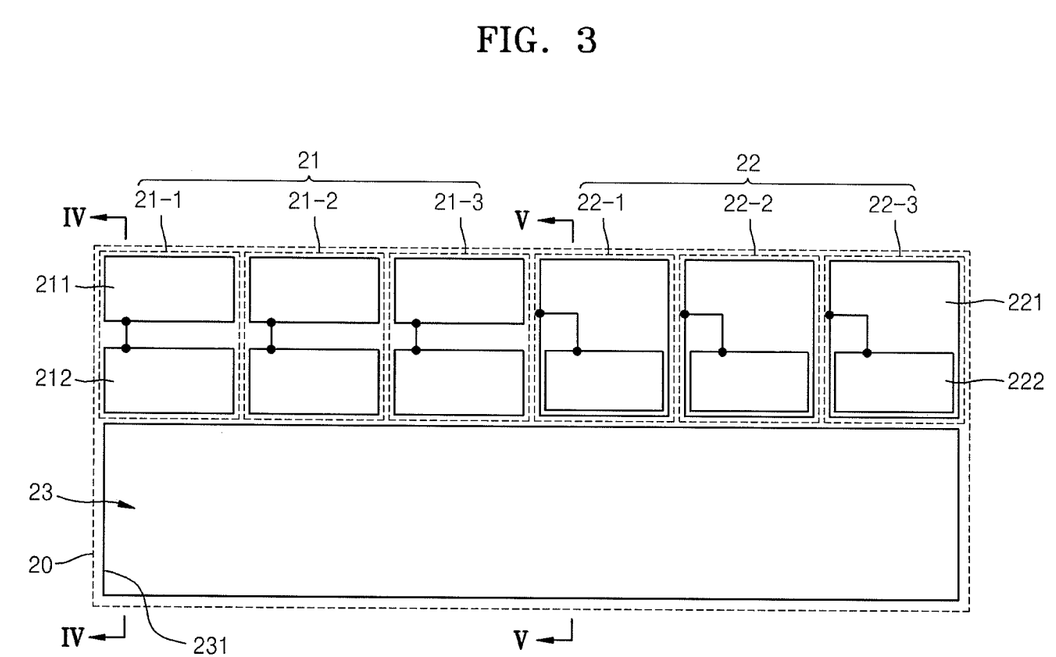
FIG. 3 is a plane view of a first pixel and a second pixel that are adjacent to each other in an organic light emission unit of FIG. 1 or 2, according to an embodiment of the present invention.

FIG. 3 is a plane view of a first pixel 21 and a second pixel 22 that are adjacent to each other in the organic light emission unit 2, according to an embodiment of the present invention. The first pixel 21 includes a 1-1 sub-pixel 21-1, a 1-2 sub-pixel 21-2, and a 1-3 sub-pixel 21-3 to realize a full-white color via emission of different colors. The second pixel 22 includes a 2-1 sub-pixel 22-1, a 2-2 sub-pixel 22-2, and a 2-3 sub-pixel 22-3 to realize a full-white color via emission of different colors. The 1-1 sub-pixel 21-1, the 1-2 sub-pixel 21-2, and the 1-3 sub-pixel 21-3 may be a red sub-pixel, a green sub-pixel, and a blue sub-pixel, respectively. The 2-1 sub-pixel 22-1, the 2-2 sub-pixel 22-2, and the 2-3 sub-pixel 22-3 may be a red sub-pixel, a green sub-pixel, and a blue sub-pixel, respectively.

Each of the 1-1 sub-pixel 21-1, the 1-2 sub-pixel 21-2, and the 1-3 sub-pixel 21-3 of the first pixel 21 includes a first emission unit 211 and a first circuit unit 212. The first emission unit 211 and the first circuit unit 212 may be disposed adjacent to each other and may not overlap with each other when viewed from a direction perpendicular to a display surface of the display device. The first circuit units 212 of the 1-1 sub-pixel 21-1, the 1-2 sub-pixel 21-2, and the 1-3 sub-pixel 21-3 of the first pixel 21 are electrically connected to the first emission units 211 of the 1-1 sub-pixel 21-1, the 1-2 sub-pixel 21-2, and the 1-3 sub-pixel 21-3, respectively.

Each of the 2-1 sub-pixel 22-1, the 2-2 sub-pixel 22-2, and the 2-3 sub-pixel 22-3 of the second pixel 22 includes a second emission unit 221 and a second circuit unit 222. The second emission unit 221 and the second circuit unit 222 may be disposed to overlap with each other when viewed from the direction. The second circuit units 222 of the 2-1 sub-pixel 22-1, the 2-2 sub-pixel 22-2, and the 2-3 sub-pixel 22-3 are electrically connected to the second emission units 221 of the 2-1 sub-pixel 22-1, the 2-2 sub-pixel 22-2, and the 2-3 sub-pixel 22-3, respectively.

The first pixel 21 and the second pixel 22 that are adjacent to each other are adjacent to a transmissive unit or area 23. For example, the first pixel 21 and the second pixel 22 that are adjacent to each other may be adjacent and in parallel to a side of the transmissive unit 23.

The first pixel 21 and the second pixel 22 may realize images in different directions. For example, the first emission units 211 of the first pixel 21 may be a bottom emission type, and the second emission units 221 of the second pixel 22 may be a top-emission type.

Because the second emission units 221 of the second pixel 22 are the top-emission type, and the second circuit units 222 overlap with the second emission units 221 when viewed from the direction, the second circuit units 222 do not interfere with the transmissive unit 23, and thus transmittance deterioration may be decreased, and emission efficiency deterioration in the second emission units 221 due to the second circuit units 222 may be decreased.

Because the first emission units 211 of the first pixel 21 are the bottom emission type, and the first circuit units 212 do not overlap with the first emission units 211 when viewed from the direction, emission efficiency deterioration in the first emission units 211 due to the first circuit units 212 may also be decreased.

As described above, the first pixel 21 and the second pixel 22 that are adjacent to each other, and the transmissive unit 23 may form one pixel structure 20.

Accordingly, a pixel circuit formed in the first circuit unit 212 of the 1-1 sub-pixel 21-1 and a pixel circuit formed in the second circuit unit 222 of the 2-1 sub-pixel 22-1 may selectively or simultaneously allow the first emission unit 211 and the second emission unit 221 of each of the sub-pixels to selectively or simultaneously emit light so as to be equivalent to or to be symmetrical with each other.

When the organic light emission unit 2 of FIGS. 1 and 2 is embodied by having a plurality of the pixel structures 20, transmittance via the transmissive unit 23 may be increased, and thus a transparent or see-through display apparatus may be embodied, and images that are equivalent to or symmetrical with each other may be selectively or simultaneously realized on top and bottom surfaces of a display apparatus.

Figure 4:
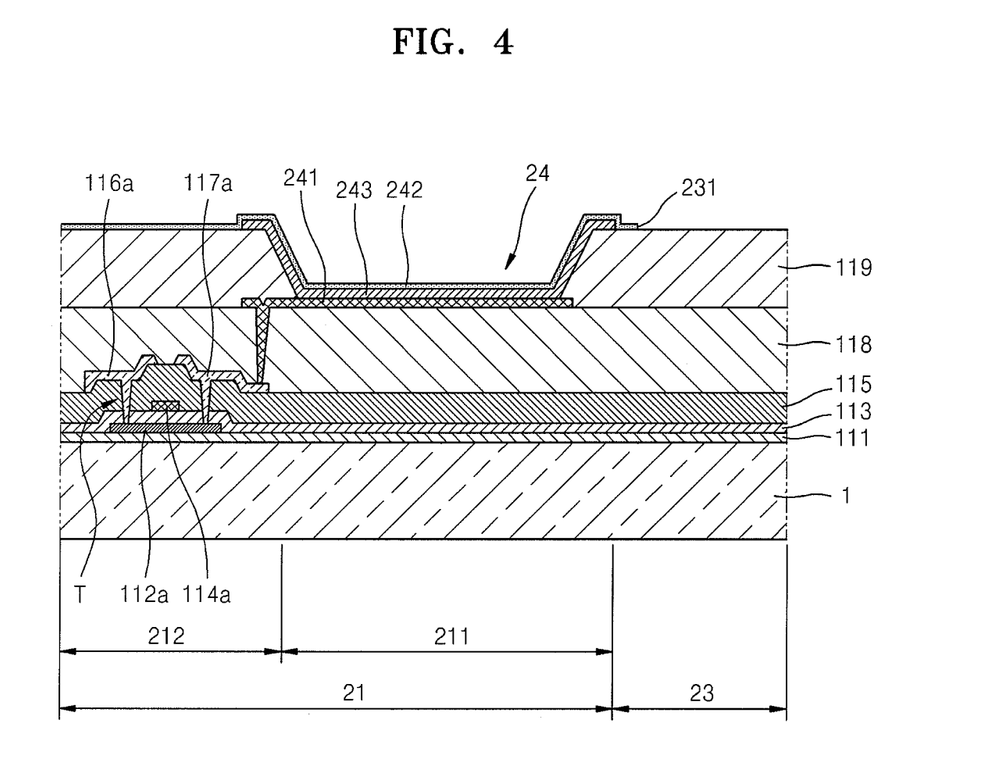
FIG. 4 is a cross-sectional view taken along a line IV-IV of FIG. 3.
Figure 5:
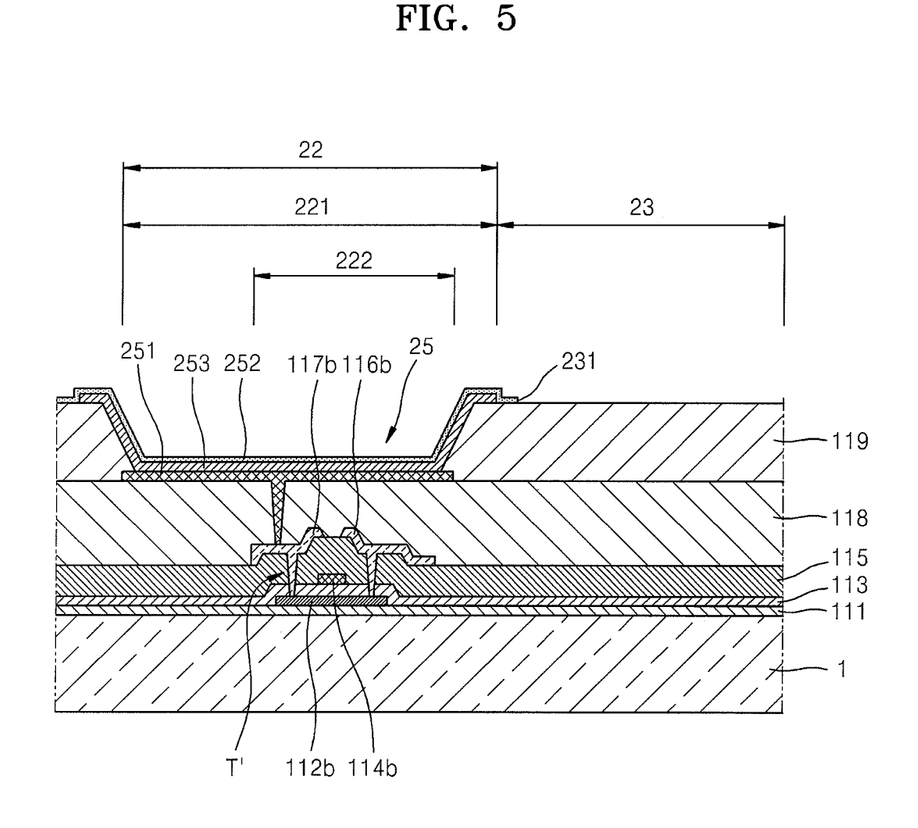
FIG. 5 is a cross-sectional view taken along a line V-V of FIG. 3.

FIGS. 4 and 5 are cross-sectional views that are respectively taken along lines IV-IV and V-V of FIG. 3, and illustrate examples of the first emission unit 211, the first circuit unit 212, the second emission unit 221, the second circuit unit 222, and the transmissive unit 23.

As shown in FIGS. 4 and 5, the first circuit unit 212 and the second circuit unit 222 are formed on the substrate 1, and here, the first circuit unit 212 and the second circuit unit 222 include at least thin-film transistors (TFTs) T and T', respectively.

In embodiments, a buffer layer 111 is formed on a surface of the substrate 1, and the TFTs T and T' are formed on the buffer layer 111.

First, a first semiconductor active layer 112a and a second semiconductor active layer 112b are formed on the buffer layer 111.

The buffer layer 111 may function to prevent penetration of foreign substances and to planarize a top surface, and may be formed of various materials capable of performing the functions. For example, the buffer layer 111 may be formed of inorganic materials including silicon oxide, silicon nitride, silicon oxynitride, aluminum oxide, aluminum nitride, titanium oxide, or titanium nitride, organic materials including polyimide, polyester, or acryl, or a multi-stack structure including these materials. The buffer layer 111 is not necessarily arranged and thus may not be formed.

The first semiconductor active layer 112a and the second semiconductor active layer 112b may be formed of, but is not limited to, polycrystalline silicon and thus may be formed as oxide semiconductors. For example, each of the first semiconductor active layer 112a and the second semiconductor active layer 112b may be a G-I—Z—O layer [$(In_2O_3)a(Ga_2O_3)b(ZnO)c$ layer] (where, a, b, and c are real numbers that satisfy a≥0, b≥0, and c>0, respectively).

A gate insulating layer 113 is formed on the buffer layer 111 so as to cover the first semiconductor active layer 112a and the second semiconductor active layer 112b, and a first gate electrode 114a and a second gate electrode 114b are formed on the gate insulating layer 113.

An interlayer insulating layer 115 is formed on the gate insulating layer 113 so as to cover the first gate electrode 114a and a second gate electrode 114b. Then, a first source electrode 116a and a first drain electrode 117a and a second source electrode 116b and a second drain electrode 117b are formed on the interlayer insulating layer 115, and contact the first semiconductor active layer 112a and the second semiconductor active layer 112b, respectively, via contact holes.

However, a structure of the TFTs T and T' is not limited to the aforementioned structure, and thus the TFTs T and T' may have one of various structures. In embodiments, the TFT T of the first circuit unit 212 and the TFT T' of the second circuit unit 222 may have different structures.

A passivation layer 118 may be formed to cover the first circuit unit 212 and the second circuit unit 222 including the TFTs T and T'. The passivation layer 118 may be a single or composite insulating layer. The passivation layer 118 may be formed of an inorganic material and/or an organic material.

As shown in FIGS. 4 and 5, a first pixel electrode 241 and a second pixel electrode 251 are formed on the passivation layer 118. The first pixel electrode 241 and the second pixel electrode 251 are respectively connected to the first drain electrode 117a and the second drain electrode 117b of the TFTs T and T' through vias or holes formed in the passivation layer 118. The first pixel electrode 241 and the second pixel electrode 251 have structures that are separated from each other.

A pixel defining layer (PDL) 119 is formed on the passivation layer 118 so as to cover side ends of the first pixel electrode 241 and the second pixel electrode 251.

A first organic layer 243 is formed on the first pixel electrode 241, and a first opposite electrode 242 is formed to cover the first organic layer 243. A first organic light-emitting device 24 is formed as a multilayered body including the first pixel electrode 241, the first organic layer 243, and the first opposite electrode 242.

A second organic layer 253 is formed on the second pixel electrode 251, and a second opposite electrode 252 is formed to cover the second organic layer 253. A second organic light-emitting device 25 is formed as a multilayered body including the second pixel electrode 251, the second organic layer 253, and the second opposite electrode 252.

The first opposite electrode 242 and the second opposite electrode 252 may be electrically connected to each other as a common electrode.

The first organic layer 243 and the second organic layer 253 may be formed of the same material. The first organic layer 243 and the second organic layer 253 may be formed as a small-molecule organic layer or a polymer organic layer. When the first organic layer 243 and the second organic layer 253 are formed as the small-molecule organic layer, in embodiments, each of the first organic layer 243 and the second organic layer 253 may have a structure in which a hole injection layer (HIL), a hole transport layer (HTL), an emission layer (EML), an electron transport layer (ETL), an electron injection layer (EIL), and the like are singularly or multiply stacked, and may be formed by using one of various organic materials including copper phthalocyanine (CuPc), N,N'-Di(naphthalene-1-yl)-N,N'-diphenyl-benzidine (NPB), tris-8-hydroxyquinoline aluminum)(Alq3), or the like. The small-molecule organic layer may be formed by using a vacuum deposition method. Here, at least one of the HIL, the HTL, the ETL, and the EIL may be commonly formed without being patterned for each of the sub-pixels of the first pixel 21 and the second pixel 22. The EML may be patterned for each of the sub-pixels. In this regard, the 1-1 sub-pixel 21-1, the 1-2 sub-pixel 21-2, and the 1-3 sub-pixel 21-3, and the 2-1 sub-pixel 22-1, the 2-2 sub-pixel 22-2, and the 2-3 sub-pixel 22-3 may be patterned to have the same-color emission layers, respectively.

The first pixel electrode 241 and the second pixel electrode 251 may function as an anode electrode, and the first opposite electrode 242 and the second opposite electrode 252 may function as a cathode electrode. Obviously, polarities of the first pixel electrode 241 and the second pixel electrode 251 and polarities of the first opposite electrode 242 and the second opposite electrode 252 may be switched.

In embodiments, the first pixel electrode 241 may have a size corresponding to the first emission unit 211 in each of the sub-pixels of the first pixel 21. Also, the second pixel electrode 251 may have a size corresponding to the second emission unit 221 in each of the sub-pixels of the second pixel 22.

The first opposite electrode 242 and the second opposite electrode 252 may apply a common voltage to all pixels of the organic light emission unit 2.

The passivation layer 118, the gate insulating layer 113, the interlayer insulating layer 115, and the PDL 119 may be formed as, but are not limited to, transparent insulating layers. Here, the substrate 1 has transmittance that is equal to or less than transmittance of the insulating layers.

According to the present embodiment, the first pixel electrode 241 may be formed as a transparent electrode, and the first opposite electrode 242 may be a reflective electrode. Thus, the first emission unit 211 corresponds to a bottom-emission type in which an image is realized toward the first pixel electrode 241.

In embodiments, the second pixel electrode 251 may be an electrode including a reflective layer, and the second opposite electrode 252 may be a transflective electrode. Thus, the second emission unit 221 corresponds to a top-emission type in which an image is realized toward the second opposite electrode 252.

As described above, when the second pixel electrode 251 is formed as a reflective electrode, the pixel circuit formed therebelow is covered by the second pixel electrode 251. That is, in FIG. 5, a user on an upper side of the second opposite electrode 252 may not view each pattern of the TFT T' below the second pixel electrode 251.

Also, because the second pixel electrode 251 is formed as the reflective electrode, emitted light travels only toward a viewer, so that an amount of light that is lost in a direction away from the viewer may be reduced.

The first pixel electrode 241 is formed as a transparent conductive layer. The transparent conductive layer may be formed of ITO, IZO, ZnO, or $In_2O_3$, which has a relatively high work function.

The second pixel electrode 251 may be formed as a multi-stack of a transparent conductive layer and a reflective layer. The transparent conductive layer may be formed of ITO, IZO, ZnO, or $In_2O_3$, which has a relatively high work function. The reflective layer may be formed of Ag, Mg, Al, Pt, Pd, Au, Ni, Nd, Ir, Cr, Li, Ca, Yb, or a compound of any of these.

The first opposite electrode 242 and the second opposite electrode 252 may be formed of a metal having a relatively small work function, e.g., Ag, Mg, Al, Pt, Pd, Au, Ni, Nd, Ir, Cr, Li, Ca, Yb, or an alloy thereof. The first opposite electrode 242 and the second opposite electrode 252 may be formed as thin-layers having relatively high transmittance, and a thickness of each of the thin-layers may be from about 100 to about 500 Å. The first opposite electrode 242 may further include a reflective layer. The reflective layer may be formed of Ag, Mg, Al, Pt, Pd, Au, Ni, Nd, Ir, Cr, Li, Ca, Yb, or a compound of any of these.

A distance between a surface of the reflective layer of the second pixel electrode 251 and the second opposite electrode 252 may be adjusted to allow optical resonance with respect to a wavelength of light generated in the EML of the second organic layer 253. Thus, the distance may vary for each of red, green, and blue sub-pixels. In order to adjust the distance for the optical resonance, a thickness of at least one of the HIL, the HTL, the ETL, and the EIL may vary for each of red, green, and blue sub-pixels, or an auxiliary layer may be further formed.

The second emission unit 221 having the aforementioned structure may correspond to the top-emission type in which an image is realized toward the second opposite electrode 252, and by adjusting the distance for the optical resonance, light extraction efficiency may be maximized.

In order to further increase external light transmittance in the transmissive unit 23, a see-through window 231 may be formed in the transmissive unit 23.

The see-through window 231 may be embodied by forming an opening in a corresponding region of the transmissive unit 23 so that none of the first opposite electrode 242 and the second opposite electrode 252 is formed in the corresponding region. Due to the see-through window 231, external light transmittance of the transmissive unit 23 may be improved.

As illustrated in FIG. 3, the see-through window 231 may have an area corresponding to the transmissive unit 23. Thus, the first pixel 21 and the second pixel 22 may be adjacent and in parallel to a side of the see-through window 231.

Although FIGS. 4 and 5 illustrate an example in which the see-through window 231 corresponds to the opening formed in the first opposite electrode 242 and the second opposite electrode 252, one or more embodiments of the present invention are not limited thereto, and thus the see-through window 231 may be further formed in at least one of the PDL 119, the passivation layer 118, the interlayer insulating layer 115, the gate insulating layer 113, and the buffer layer 111.

Figure 6:
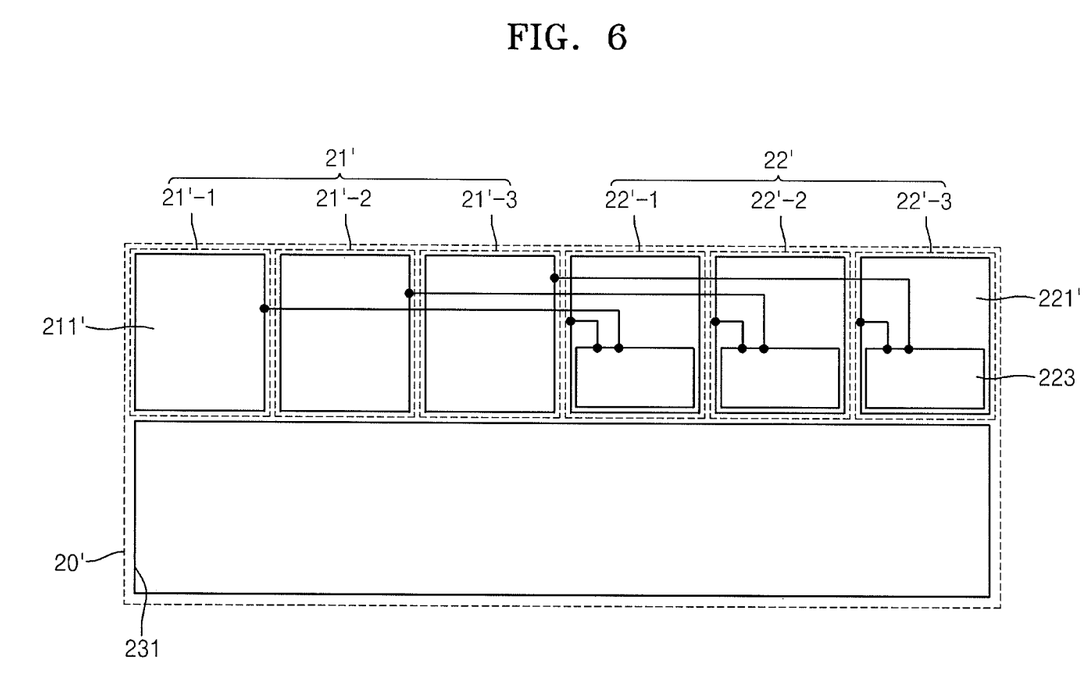
FIG. 6 is a plane view of a first pixel and a second pixel that are adjacent to each other in the organic light emission unit of FIG. 1 or 2, according to another embodiment of the present invention.

FIG. 6 is a plane view of a first pixel 21' and a second pixel 22' that are adjacent to each other in the organic light emission unit 2, according to another embodiment of the present invention. Similar to the embodiment illustrated in FIG. 3, the first pixel 21' includes a 1-1 sub-pixel 21'-1, a 1-2 sub-pixel 21'-2, and a 1-3 sub-pixel 21'-3, and the second pixel 22' includes a 2-1 sub-pixel 22'-1, a 2-2 sub-pixel 22'-2, and a 2-3 sub-pixel 22'-3.

Unlike the embodiment illustrated in FIG. 3, in the present embodiment illustrated in FIG. 6, each of the 1-1 sub-pixel 21'-1, the 1-2 sub-pixel 21'-2, and the 1-3 sub-pixel 21'-3 of the first pixel 21' includes a first emission unit 211' without a circuit unit.

Each of the 2-1 sub-pixel 22'-1, the 2-2 sub-pixel 22'-2, and the 2-3 sub-pixel 22'-3 of the second pixel 22' includes a second emission unit 221' and a circuit unit 223. The second emission unit 221' and the circuit unit 223 may overlap with each other when viewed from the direction. The second emission units 221' of the 2-1 sub-pixel 22'-1, the 2-2 sub-pixel 22'-2, and the 2-3 sub-pixel 22'-3 of the second pixel 22' are electrically connected to the circuit units 223, and the first emission unit 211' of the 1-1 sub-pixel 21'-1, the 1-2 sub-pixel 21'-2, and the 1-3 sub-pixel 21'-3 of the first pixel 21' are electrically connected to the circuit units 223.

Similar to the embodiment illustrated in FIG. 3, the first pixel 21' and the second pixel 22' may realize images in different directions. For example, the first emission units 211' of the first pixel 21' may be a bottom emission type, and the second emission units 221' of the second pixel 22' may be a top-emission type.

As described above, the first pixel 21' and the second pixel 22' that are adjacent to each other, and a transmissive unit 23' may form one pixel structure 20'.

Pixel circuits formed in the circuit units 223 simultaneously drive the first emission units 211' of the 1-1 sub-pixel 21'-1, the 1-2 sub-pixel 21'-2, and the 1-3 sub-pixel 21'-3 of the first pixel 21', and the second emission units 221' of the 2-1 sub-pixel 22'-1, the 2-2 sub-pixel 22'-2, and the 2-3 sub-pixel 22'-3 of the second pixel 22'.

Figure 7:
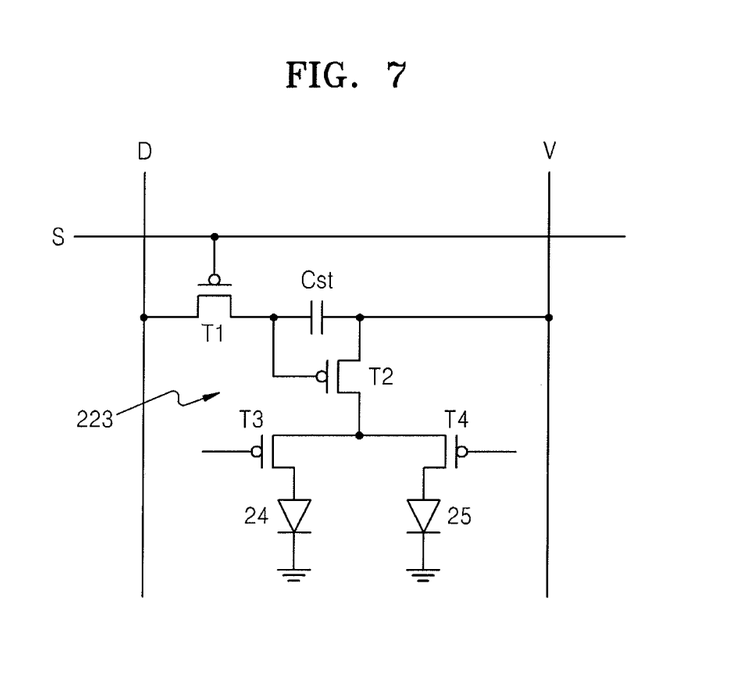
FIG. 7 is a circuit view illustrating in detail an example of a circuit unit of FIG. 6.

FIG. 7 is a circuit view illustrating in detail an example of the circuit unit 223 of FIG. 6.

Referring to FIG. 7, a scan line S, a data line D, and a Vdd line V that is a driving power source are electrically connected to the circuit unit 223. Although not illustrated in FIG. 7, according to a configuration of the circuit unit 223, other various conductive lines, in addition to the scan line S, the data line D, and the Vdd line V, may be further arranged.

The circuit unit 223 includes a first TFT T1 connected to the scan line S and the data line D, a second TFT T2 connected to the first TFT T1 and the Vdd line V, and a capacitor Cst connected to the first TFT T1 and the second TFT T2.

A gate electrode of the first TFT T1 is connected to the scan line S and thus receives a scan signal, a first electrode of the first TFT T1 is connected to the data line D, and a second electrode of the first TFT T1 is connected to the capacitor Cst and a gate electrode of the second TFT T2.

A first electrode of the second TFT T2 is connected to the Vdd line V and the capacitor Cst, and a second electrode of the second TFT T2 is connected to each of first electrodes of a first emission TFT T3 and a second emission TFT T4.

Here, the first TFT T1 corresponds to a switching transistor, and the second TFT T2 corresponds to a driving transistor.

A second electrode of the first emission TFT T3 is electrically connected to a first organic light-emitting device 24', and a second electrode of the second emission TFT T4 is electrically connected to a second organic light-emitting device 25'. In the embodiment illustrated in FIG. 6, the first organic light-emitting device 24' may be arranged at the first emission unit 211' of each of the 1-1 sub-pixel 21'-1, the 1-2 sub-pixel 21'-2, and the 1-3 sub-pixel 21'-3 of the first pixel 21', and the second organic light-emitting device 25' may be arranged at the second emission unit 221' of each of the 2-1 sub-pixel 22'-1, the 2-2 sub-pixel 22'-2, and the 2-3 sub-pixel 22'-3 of the second pixel 22'.

Gate electrodes of the first emission TFT T3 and the second emission TFT T4 are electrically connected to separate emission signal lines, respectively.

In the example shown in FIG. 7, all of the TFTs T1 through T4 correspond to, but are not limited to, a p-type, and thus at least one of them may be formed as an n-type. The number of the TFTs T1 through T4 and the capacitor Cst is not limited to the example, and thus, according to a pixel circuit unit 223, two or more TFTs and at least one capacitor may be further arranged.

According to the aforementioned configuration of the circuit unit 223, image information input via the data line D is realized by the first organic light-emitting device 24' when the first emission TFT T3 is open, and image information input via the data line D is realized by the second organic light-emitting device 25' when the second emission TFT T4 is open, so that the first organic light-emitting device 24' and the second organic light-emitting device 25' may realize different images. Thus, an image on a top emission surface and an image on a bottom emission surface may be reversed like a mirror image with respect to each other by timedivision driving so that dual-emission may be achieved in an unseen manner. Obviously, when the same switching signal is applied to the first emission TFT T3 and the second emission TFT T4 while the same data signal is applied thereto, reversed mirror images may be viewed on a top surface and a bottom surface. As described above, the circuit unit 223 may enable various screen displays while the first organic light-emitting device 24' and the second organic light-emitting device 25' share a basic configuration of a pixel circuit unit.

Figure 8:
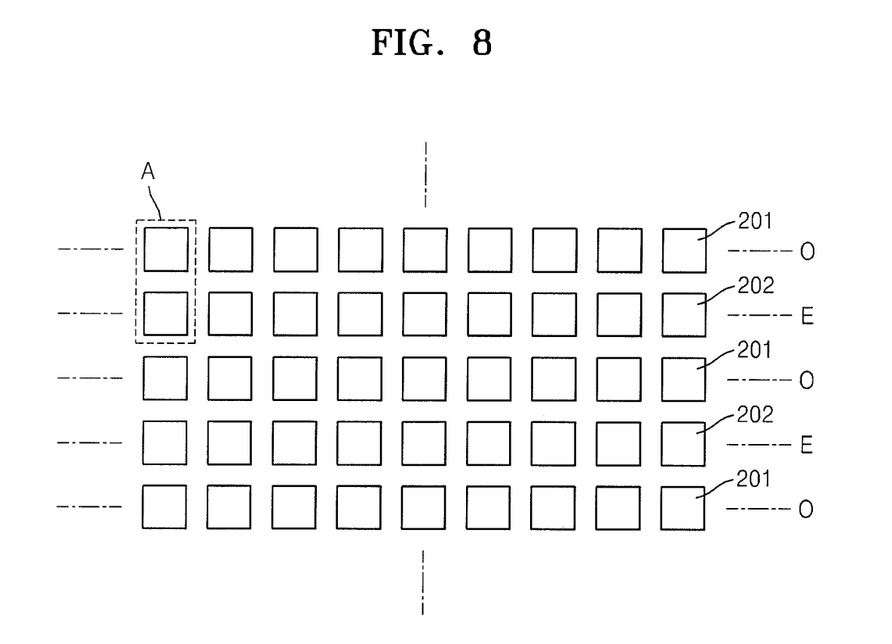
FIG. 8 illustrates another example of the organic light emission unit of FIG. 1 or 2, according to an embodiment of the present invention.

FIG. 8 illustrates disposition of pixels in the organic light emission unit 2, according to an embodiment of the present invention. In the embodiment illustrated in FIG. 8, first pixel structures 201 are disposed at every odd row 0, and second pixel structures 202 are disposed at every even row E. The first pixel structures 201 may be for bottom emission and transmittance of external light, and the second pixel structures 202 may be for top emission and transmittance of external light. The first pixel structures 201 and the second pixel structures 202 may simultaneously or selectively realize the same or different images. In the embodiment illustrated in FIG. 8, the same pixel structures are disposed at, but are not limited to, every row, and thus the same pixel structures may be disposed at every column.

Figure 9:
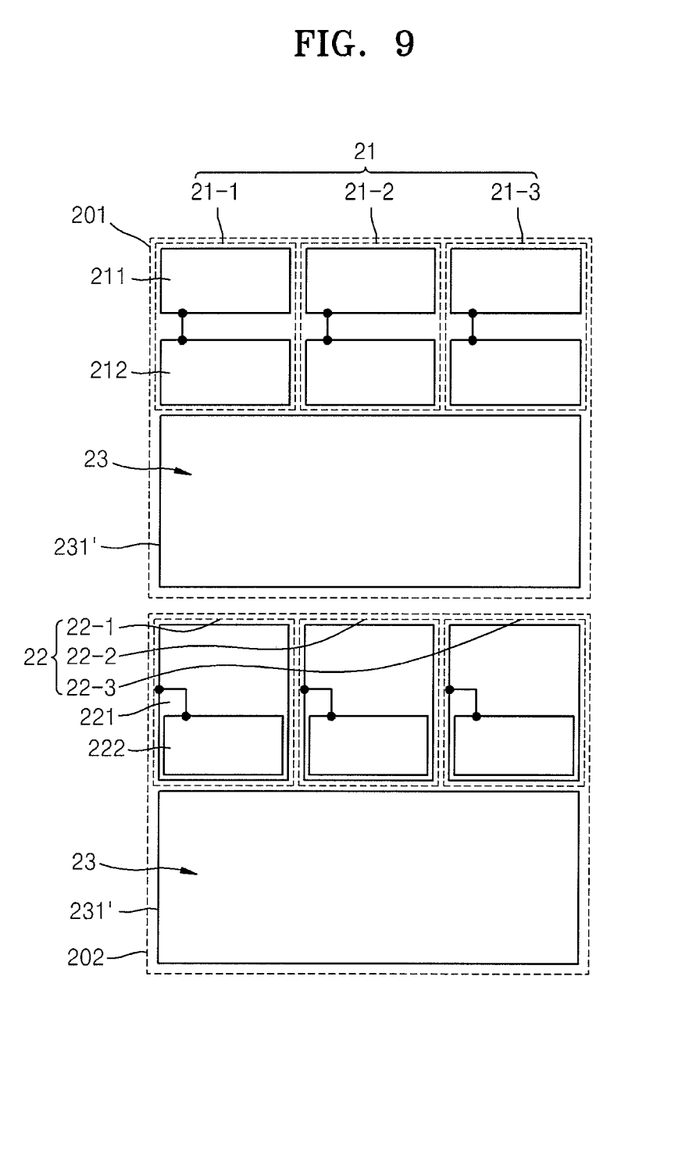
FIG. 9 is a plane view illustrating an example of a portion A of FIG. 8.

FIG. 9 illustrates an example of a portion A of FIG. 8.

The first pixel structure 201 disposed at the odd row 0 may have the first pixel 21. The first pixel 21 includes the 1-1 sub-pixel 21-1, the 1-2 sub-pixel 21-2, and the 1-3 sub-pixel 21-3, which realize a full-white color via emission of different colors. Each of the 1-1 sub-pixel 21-1, the 1-2 sub-pixel 21-2, and the 1-3 sub-pixel 21-3 of the first pixel 21 includes the first emission unit 211 and the first circuit unit 212. The first emission unit 211 and the first circuit unit 212 may be disposed adjacent to each other and may not overlap with each other when viewed from the direction. The first circuit units 212 of the 1-1 sub-pixel 21-1, the 1-2 sub-pixel 21-2, and the 1-3 sub-pixel 21-3 of the first pixel 21 are electrically connected to the first emission units 211 of the 1-1 sub-pixel 21-1, the 1-2 sub-pixel 21-2, and the 1-3 sub-pixel 21-3 of the first pixel 21, respectively.

The 1-1 sub-pixel 21-1, the 1-2 sub-pixel 21-2, and the 1-3 sub-pixel 21-3 are adjacent to the transmissive unit 23. An opening window 231' may be formed in the transmissive unit 23, and in this regard, the 1-1 sub-pixel 21-1, the 1-2 sub-pixel 21-2, and the 1-3 sub-pixel 21-3 are adjacent and in parallel to a side of the opening window 231'.

The second pixel structure 202 disposed at the even row E may have the second pixel 22. The second pixel 22 includes the 2-1 sub-pixel 22-1, the 2-2 sub-pixel 22-2, and the 2-3 sub-pixel 22-3, which realize a full-white color via emission of different colors.

Each of the 2-1 sub-pixel 22-1, the 2-2 sub-pixel 22-2, and the 2-3 sub-pixel 22-3 of the second pixel 22 includes the second emission unit 221 and the second circuit unit 222. The second emission unit 221 and the second circuit unit 222 may be disposed to overlap with each other when viewed from the direction. The second pixels 222 of the 2-1 sub-pixel 22-1, the 2-2 sub-pixel 22-2, and the 2-3 sub-pixel 22-3 are electrically connected to the second emission units 221 of the 2-1 sub-pixel 22-1, the 2-2 sub-pixel 22-2, and the 2-3 sub-pixel 22-3, respectively.

The 2-1 sub-pixel 22-1, the 2-2 sub-pixel 22-2, and the 2-3 sub-pixel 22-3 are adjacent to the transmissive unit 23. The opening window 231' may be formed in the transmissive unit 23, and in this regard, the 2-1 sub-pixel 22-1, the 2-2 sub-pixel 22-2, and the 2-3 sub-pixel 22-3 are adjacent and in parallel to a side of the opening window 231'.

Detailed descriptions of the aforementioned elements are the same as those of the embodiment illustrated in FIG. 3, and thus are omitted here.

Figure 10:
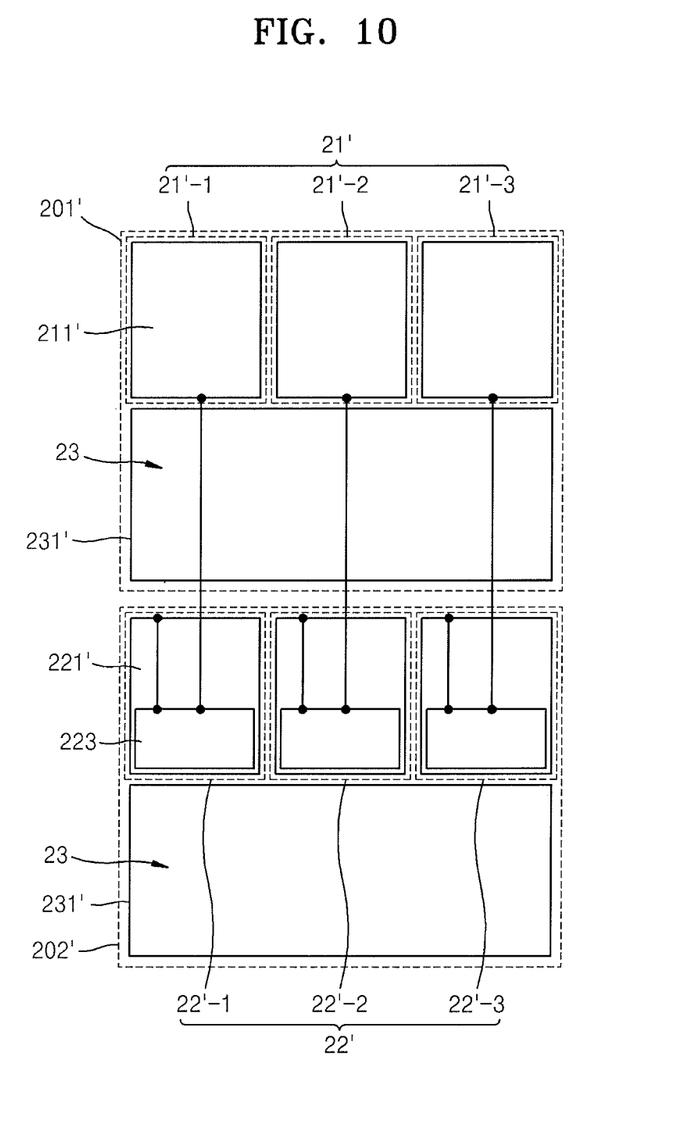
FIG. 10 is a plane view illustrating another example of the portion A of FIG. 8.

FIG. 10 illustrates another example of the portion A of FIG. 8.

Each of the sub-pixels 21'-1, 21'-2, and 21'-3 of a first pixel structures 201' that disposed at the odd row 0 includes the first emission unit 211' without a circuit unit, similar to the embodiment illustrated in FIG. 6.

Each of the sub-pixels 22'-1, 22'-2, and 22'-3 of a second pixel structures 202' that is disposed at the even row E includes the second emission unit 221' and the circuit unit 223, similar to the embodiment illustrated in FIG. 6. The second emission unit 221' and the circuit unit 223 may overlap with each other when viewed from the direction. The second emission units 221' of the sub-pixels 22'-1, 22'-2, and 22'-3 of the second pixel 22' are electrically connected to the circuit units 223, respectively, and the first emission units 211' of the sub-pixels 22'-1, 22'-2, and 22'-3 of the first pixel 21' are electrically connected to the circuit units 223, respectively.

Detailed descriptions of the aforementioned elements are the same as those of the embodiment illustrated in FIG. 6, and thus are omitted here.

As described above, in the embodiments of FIGS. 8 through 10, users on a top surface side and a bottom surface side of a transparent or see-through display may simultaneously or respectively view the same or different images, and may view an image that is transmitted to both the top surface side and the bottom surface side.

While embodiments of the present invention have been particularly shown and described, it will be understood by those of ordinary skill in the art that various changes in form and details may be made therein without departing from the spirit and scope of the present invention as defined by the following claims.

What is claimed is:

1. An organic light-emitting display apparatus having a scan line and a data line, the apparatus comprising:
a first emission unit comprising a first organic light-emitting device configured to emit light in at least a first direction and through a first display surface, wherein the first organic light-emitting device comprises a first pixel electrode;a first opposite electrode facing the first pixel electrode, and a first organic emission layer disposed between the first pixel electrode and the first opposite electrode;
a second emission unit comprising a second organic light-emitting device configured to emit light in a second direction opposite to the first direction and through a second display surface opposing the first display surface, wherein the first emission unit and the second emission unit are alternately disposed, and the second organic light-emitting device comprises a second pixel electrode, a second opposite electrode facing the second pixel electrode, and a second organic emission layer disposed between the second pixel electrode and the second opposite electrode;
a transmissive area disposed adjacent to but not overlapping with the first emission unit and the second emission unit when viewed from a direction perpendicular to the first display surface, and configured to transmit external light through the first and second display surfaces in the transmissive area, wherein the transmissive area does not overlap the first opposite electrode and the second opposite electrode; and a circuit unit which is electrically connected to the first emission unit and the second emission unit, wherein the circuit unit comprises;

a first emission TFT and a second emission TFT, the first emission TFT comprising a first electrode, a second electrode and a gate electrode, and the second emission TFT comprising a first electrode, a second electrode and a gate electrode; and a switching TFT and a driving TFT, the switching TFT comprising a first electrode, a second electrode and a gate electrode, and the driving TFT comprising a first electrode, a second electrode and a gate electrode, wherein the first electrode of the first emission TFT is electrically connected to the second emission TFT, and the second electrode of the first emission TFT is electrically connected to the first organic light-emitting device, wherein the first electrode of the second emission TFT is electrically connected to the first emission TFT, and the second electrode of the second emission TFT is electrically connected to the second organic light-emitting device, wherein the gate electrode of the switching TFT is connected to the scan line and the first electrode of the switching TFT is connected to the data line, wherein the gate electrode of the driving TFT is connected to the second electrode of the switching TFT, and the second electrode of the driving TFT is connected to the first electrodes of the first and second emission TFT, wherein the first organic light-emitting device is arranged apart from the second organic light-emitting device, and from the direction perpendicular to the first display surface, the first emission TFT and the second emission TFT overlap the second emission unit, not the first emission unit, wherein the first pixel electrode and the second pixel electrode are disposed to be spaced apart from each other in a third direction, wherein the apparatus further comprises a third pixel electrode and the fourth pixel electrode, the third and fourth pixel electrodes being spaced apart from each other in the third direction, being spaced apart from the first pixel electrode and the second pixel electrode, and being disposed between the first pixel electrode and the second pixel electrode in the third direction, and wherein the transmissive area extends from the first pixel electrode to the second pixel electrode in the third direction.

2. The organic light-emitting display apparatus of claim 1, the circuit unit further comprising a capacitor electrically connected to the switching TFT and the driving TFT.

3. The organic light-emitting display apparatus of claim 1, wherein the third pixel electrode and the fourth pixel electrode are adjacent to a side of the transmissive area.

4. The organic light-emitting display apparatus of claim 1, wherein the third pixel el ctrode and the fourth pixel electrode are not electrically connected to the first emission TFT and the second emission TFT.

5. The organic light-emitting display apparatus of claim 1, wherein the circuit unit does not overlap the third pixel electrode and the fourth pixel electrode.

* * * * *